United States Patent
Ahn (10) Patent No.: US 11,125,823 B2
(45) Date of Patent: Sep. 21, 2021

(54) METHOD FOR ESTIMATING PARAMETER OF EQUIVALENT CIRCUIT MODEL FOR BATTERY, AND BATTERY MANAGEMENT SYSTEM

(71) Applicant: LG CHEM, LTD., Seoul (KR)

(72) Inventor: Hyoung Jun Ahn, Daejeon (KR)

(73) Assignee: LG Chem, Ltd., Seoul (KR)

( * ) Notice: Subject to any disclaimer, the term of this patent is extended or adjusted under 35 U.S.C. 154(b) by 48 days.

(21) Appl. No.: 16/617,090

(22) PCT Filed: Jan. 15, 2019

(86) PCT No.: PCT/KR2019/000608
§ 371 (c)(1),
(2) Date: Nov. 26, 2019

(87) PCT Pub. No.: WO2019/156377
PCT Pub. Date: Aug. 15, 2019

(65) Prior Publication Data
US 2020/0081066 A1 Mar. 12, 2020

(30) Foreign Application Priority Data
Feb. 7, 2018 (KR) .......................... 10-2018-0015139

(51) Int. Cl.
*G01R 31/367* (2019.01)
*G01R 31/3842* (2019.01)
(Continued)

(52) U.S. Cl.
CPC ......... *G01R 31/367* (2019.01); *G01R 31/382* (2019.01); *G01R 31/3842* (2019.01);
(Continued)

(58) Field of Classification Search
None
See application file for complete search history.

(56) References Cited

U.S. PATENT DOCUMENTS 9,091,735 B2 * 7/2015 Wang ................... G01R 31/367
10,663,524 B2 5/2020 Kawai et al.
(Continued)

FOREIGN PATENT DOCUMENTS

CN 103197251 A 7/2013
CN 103926538 A 7/2014
(Continued)

OTHER PUBLICATIONS

Extended European Search Report dated Nov. 12, 2020, issued in corresponding European Patent Application No. 19750279.2.
(Continued)

*Primary Examiner* — John C Kuan
(74) *Attorney, Agent, or Firm* — Morgan, Lewis & Bockius LLP (57) ABSTRACT

Disclosed is a method and a battery management system for estimating the parameters of an equivalent circuit model for a battery. The equivalent circuit model includes a first resistor, a second resistor connected in series to the first resistor and a capacitor connected in parallel to the second resistor. The method according to an embodiment of the present disclosure individually estimates the resistance of the first resistor and the resistance of the second resistor based on a first number of terminal voltages and a first number of currents measured in a sequential order at each time step in a sliding time window having a predefined size, and stores data indicating the estimated results in the memory.

11 Claims, 7 Drawing Sheets

(51) Int. Cl.
*G01R 31/382* (2019.01)
*H03H 21/00* (2006.01)
*G06F 17/10* (2006.01)
*G06F 17/18* (2006.01)

(52) U.S. Cl.
CPC .............. *G06F 17/10* (2013.01); *G06F 17/18* (2013.01); *H03H 2021/005* (2013.01); *H03H 2021/0049* (2013.01)

(56) References Cited

U.S. PATENT DOCUMENTS

| | | | |
|---|---|---|---|
| 2007/0159137 A1* | 7/2007 | Verbrugge | G01R 31/3828 320/132 |
| 2009/0091299 A1* | 4/2009 | Lin | H01M 10/482 320/137 |
| 2012/0101753 A1* | 4/2012 | Lin | H01M 10/48 702/63 |
| 2013/0166235 A1 | 6/2013 | Oh et al. | |
| 2013/0320989 A1* | 12/2013 | Inoue | B60L 58/16 324/427 |
| 2014/0372053 A1* | 12/2014 | Lin | G01R 31/3648 702/63 |
| 2015/0288197 A1 | 10/2015 | Choi | |
| 2015/0377978 A1 | 12/2015 | Mitsuyama et al. | |
| 2018/0017628 A1 | 1/2018 | Takegami et al. | |
| 2019/0023132 A1 | 1/2019 | Yonemoto et al. | |

FOREIGN PATENT DOCUMENTS

| | | |
|---|---|---|
| CN | 106126783 A | 11/2016 |
| CN | 106646253 A | 5/2017 |
| CN | 106908732 A | 6/2017 |
| CN | 107561445 A | 1/2018 |
| JP | 2011-106952 A | 6/2011 |
| JP | 2011-122951 A | 6/2011 |
| JP | 2015-224919 A | 12/2015 |
| JP | 2016-003963 A | 1/2016 |
| JP | 2017-090282 A | 5/2017 |
| JP | 2017-162661 A | 9/2017 |
| KR | 10-2013-0060623 A | 6/2013 |
| KR | 10-2015-0025932 A | 3/2015 |
| KR | 10-2017-0058165 A | 5/2017 |

OTHER PUBLICATIONS

International Search Report issued in corresponding International Patent Application No. PCT/KR2019/000608, dated Apr. 26, 2019.
Office Action dated May 6, 2021, issued in corresponding Chinese Patent Application No. 201980002839.X.
Wenguan Wang, et al., "Near-Real-Time Parameter Estimation of an Electrical Battery Model with Multiple Time Constants and SOC-Dependent Capacitance," IEEE Transactions on Power Electronics, Nov. 2014, vol. 29, Issue 11, pp. 5905-5920.
Bi Jun, et al., "Parameters Identification of Nernst Model for Power Lithium-ion Battery of Pure Electric Vehicles," Automotive Engineering, Jun. 2015, vol. 37, No. 6, pp. 725-730. (English Abstract).

* cited by examiner

METHOD FOR ESTIMATING PARAMETER OF EQUIVALENT CIRCUIT MODEL FOR BATTERY, AND BATTERY MANAGEMENT SYSTEM

TECHNICAL FIELD

The present disclosure relates to a method and a battery management system for estimating the parameters of an equivalent circuit model for a battery.

The present application claims priority to Korean Patent Application No. 10-2018-0015139 filed in the Republic of Korea on Feb. 7, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

To prevent the overcharge and overdischarge of a battery, it is necessary to adjust the charge current and the discharge current of the battery according to the state of charge (SOC) of the battery. However, the SOC of the battery cannot be directly measured, and is estimated based on the terminal voltage and the current of the battery. Accordingly, to control the battery more safely and efficiently, most of all, it is important to accurately estimate the SOC of the battery.

One of battery SOC estimation techniques is ampere counting (also called a current integration method). The ampere counting estimates the SOC of the battery from the results of time-sequentially accumulating the current of the battery periodically measured by a current sensor. However, due to the precision of the current sensor itself or external noise, there is a difference between the current of the battery measured by the current sensor and the battery actual current, and a difference between the SOC estimated by ampere counting and the actual SOC also increases over times.

Another conventional art for solving the above-described problem uses the extended kalman filter (EKF) to estimate the SOC of the battery. The EKF uses ampere counting together with an equivalent circuit model for predicting a change in voltage with the current of the battery, and thus can estimate the SOC of the battery more accurately than an approach simply using ampere counting alone.

During the operation of the EKF, it is necessary to periodically update the parameters of the equivalent circuit model based on the battery terminal voltage, the battery current and/or the battery temperature using a given parameter map. The data included in the parameter map according to the conventional art indicates fixed values determined from the charge/discharge test results of experimental batteries. Accordingly, the parameters of the equivalent circuit model updated using the parameter map according to the conventional art fail to fully reflect changes in electrochemical properties (for example, an increase in internal resistance) of the battery due to deviations in the manufacturing process of the battery or repeated charging/discharging.

DISCLOSURE

Technical Problem

The present disclosure is designed to solve the above-described problem, and therefore the present disclosure is directed to providing a method and a battery management system for periodically updating the parameters of an equivalent circuit model that models the dynamic characteristics of the terminal voltage of a battery based on the terminal voltage and the current of the battery measured in periodic manner.

These and other objects and advantages of the present disclosure can be understood by the following description and will be apparent from the embodiments of the present disclosure. Further, it will be readily understood that the objects and advantages of the present disclosure can be realized by the means set forth in the appended claims and combinations thereof.

Technical Solution

A method according to an aspect of the present disclosure is for estimating the parameters of an equivalent circuit model for a battery, and the equivalent circuit model includes a first resistor, a second resistor connected in series to the first resistor and a capacitor connected in parallel to the second resistor. The method includes reading, from a memory, measurement data indicating a first number of terminal voltages and a first number of currents measured in a sequential order at each time step in a sliding time window having a predefined size, calculating a voltage variation of a current time step based on a terminal voltage measured at the current time step and a terminal voltage measured at a previous time step included in the first number of terminal voltages, calculating a current variation of the current time step based on a current measured at the current time step and a current measured at the previous time step included in the first number of currents, estimating a resistance of the first resistor at the current time step based on a resistance of the first resistor estimated at the previous time step, the voltage variation and the current variation, generating a measured voltage vector based on the first number of terminal voltages and a measured current vector based on the first number of currents, and estimating a resistance of the second resistor at the current time step based on the measured voltage vector, the measured current vector, the resistance of the first resistor estimated at the current time step and a resistance of the second resistor estimated at the previous time step.

The step of estimating the resistance of the first resistor at the current time step may be performed when a first data filtering condition is satisfied. The first data filtering condition may be satisfied when an absolute value of the current variation is larger than a first threshold, and multiplication of the voltage variation and the current variation is a positive value.

The method may further include setting the resistance of the first resistor estimated at the previous time step as the resistance of the first resistor estimated at the current time step, when the first data filtering condition is not satisfied.

The step of estimating the resistance of the first resistor at the current time step may include the following Equations 1 and 2 related to a recursive least square algorithm, $$P_1(n) = \frac{1}{\lambda}\left\{P_1(n-1) - \frac{P_1(n-1)^2 \Delta I(n)^2}{\lambda + P_1(n-1)\Delta I(n)^2}\right\} \quad \text{<Equation 1>}$$

$$R_{1\_est}(n) = \quad \text{<Equation 2>}$$
$$R_{1\_est}(n-1) + P_1(n)\Delta I(n)\{\Delta V(n) - R_{1\_est}(n-1)\Delta I(n)\}$$

wherein $P_1(n)$ is a correction factor for the current time step, $P_1(n-1)$ is a correction factor for the previous time step, $\Delta I(n)$ is the current variation, $\Delta V(n)$ is the voltage variation, $\lambda$ is a predefined forgetting factor, $R_{1\_est}(n)$ is the resistance of the first resistor estimated at the current time step, and $R_{1\_est}(n-1)$ is the resistance of the first resistor estimated at the previous time step.

The step of estimating the resistance of the second resistor at the current time step may be performed when the first number of currents satisfy a second data filtering condition. The second data filtering condition may be satisfied when a difference between maximum and minimum of the first number of currents is larger than a second threshold.

The step of estimating the resistance of the second resistor at the current time step may include generating a measured voltage vector based on the first number of terminal voltages and a measured current vector based on the first number of currents, generating a reference voltage vector based on the measured voltage vector, the measured current vector and the resistance of the first resistor estimated at the current time step, generating a first feature vector, a first parameter vector and a first model voltage vector based on the equivalent circuit model and the measured current vector, estimating a resistance of the second resistor indicating transient response history of the battery in the sliding time window based on the reference voltage vector and the first feature vector, calculating a first error value corresponding to a sum of least square errors between the reference voltage vector and the first model voltage vector based on the reference voltage vector and the first feature vector, generating a second feature vector, a second parameter vector and a second model voltage vector based on a substitute circuit model as a result of removing the second resistor from the equivalent circuit model and the measured current vector, calculating a second error value corresponding to a sum of least square errors between the reference voltage vector and the second model voltage vector based on the reference voltage vector and the second feature vector, determining whether a third data filtering condition is satisfied based on the estimated resistance of the second resistor indicating the transient response history of the battery in the sliding time window, the first error value and the second error value, and estimating a resistance of the second resistor indicating the transient response history of the battery in a current observation period from an initial time step to the current time step based on the measured voltage vector, the measured current vector, the resistance of the first resistor estimated at the current time step and the resistance of the second resistor estimated at the previous time step, when the third data filtering condition is satisfied.

The third data filtering condition may be satisfied when the estimated resistance of the second resistor indicating the transient response history of the battery in the sliding time window is larger than 0 ohm, and the second error value is larger than a value obtained by multiplying the first error value by a preset scaling factor.

The step of estimating the resistance of the second resistor at the current time step may use a recursive least square algorithm.

A battery management system according to another aspect of the present disclosure is for estimating the parameters of an equivalent circuit model for a battery, and the equivalent circuit model includes a first resistor, a second resistor connected in series to the first resistor and a capacitor connected in parallel to the second resistor. The battery management system includes a sensing unit configured to measure a terminal voltage and a current of the battery at each time step, and a control unit operably coupled to the sensing unit, and configured to record the terminal voltage and the current measured by the sensing unit at each time step in a memory. The control unit reads, from the memory, measurement data indicating a first number of terminal voltages and a first number of currents measured in a sequential order at each time step in a sliding time window having a predefined size. The control unit is configured to calculate a voltage variation of a current time step based on a terminal voltage measured at the current time step and a terminal voltage measured at a previous time step included in the first number of terminal voltages. The control unit is configured to calculate a current variation of a current time step based on a current measured at the current time step and a current measured at the previous time step included in the first number of currents. The control unit is configured to estimate a resistance of the first resistor at the current time step based on a resistance of the first resistor estimated at the previous time step, the voltage variation and the current variation. The control unit is configured to generate a measured voltage vector based on the first number of terminal voltages and a measured current vector based on the first number of currents. The control unit is configured to estimate a resistance of the second resistor at the current time step based on the measured voltage vector, the measured current vector, the resistance of the first resistor estimated at the current time step and a resistance of the second resistor estimated at the previous time step.

The control unit may be configured to generate a measured voltage vector based on the first number of terminal voltages and a measured current vector based on the first number of currents. The control unit may be configured to generate a reference voltage vector based on the measured voltage vector, the measured current vector and the resistance of the first resistor estimated at the current time step. The control unit may be configured to generate a first feature vector, a first parameter vector and a first model voltage vector based on the equivalent circuit model and the measured current vector. The control unit may be configured to estimate a resistance of the second resistor indicating transient response history of the battery in the sliding time window based on the reference voltage vector and the first feature vector. The control unit may be configured to calculate a first error value corresponding to a sum of least square errors between the reference voltage vector and the first model voltage vector based on the reference voltage vector and the first feature vector. The control unit may be configured to generate a second feature vector, a second parameter vector and a second model voltage vector based on a substitute circuit model as a result of removing the second resistor from the equivalent circuit model and the measured current vector. The control unit may be configured to calculate a second error value corresponding to a sum of least square errors between the reference voltage vector and the second model voltage vector based on the reference voltage vector and the second feature vector. The control unit may be configured to determine whether a third data filtering condition is satisfied based on the estimated resistance of the second resistor indicating the transient response history of the battery in the sliding time window, the first error value and the second error value. The control unit may be configured to estimate a resistance of the second resistor indicating the transient response history of the battery in a current observation period from an initial time step to the current time step based on the measured voltage vector and the measured current vector, when the third data filtering condition is satisfied.

The third data filtering condition may be satisfied when the estimated resistance of the second resistor indicating the transient response history of the battery in the sliding time window is larger than 0 ohm, and the second error value is larger than a value obtained by multiplying the first error value by a preset scaling factor.

Advantageous Effects

According to at least one of the embodiments of the present disclosure, it is possible to periodically update the parameters of an equivalent circuit model that models the dynamic characteristics of the terminal voltage of a battery based on the terminal voltage and the current of the battery measured in periodic manner.

The periodically updated parameters of the equivalent circuit model reflect the dynamic characteristics of the battery changing as the battery degrades. Thus, according to the present disclosure, the parameters of the equivalent circuit model are adaptively adjusted as the battery degrades, making it possible to predict the terminal voltage of the battery more accurately. Additionally, the predicted terminal voltage can be used to control a component (for example, a switch) electrically coupled to the battery, making it possible to prevent the overvoltage, undervoltage, overcharge and/or overdischarge of the battery.

According to at least one of the embodiments of the present disclosure, after checking whether measurement data indicating a predefined number of terminal voltages and currents measured in the sliding time window is suitable for learning data for estimating the parameters of the equivalent circuit model, only when determined to be suitable, the measurement data may be used to estimate the parameters of the equivalent circuit model. Accordingly, it is possible to reduce a difference between the terminal voltage predicted based on the parameters of the equivalent circuit model and the actual terminal voltage.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
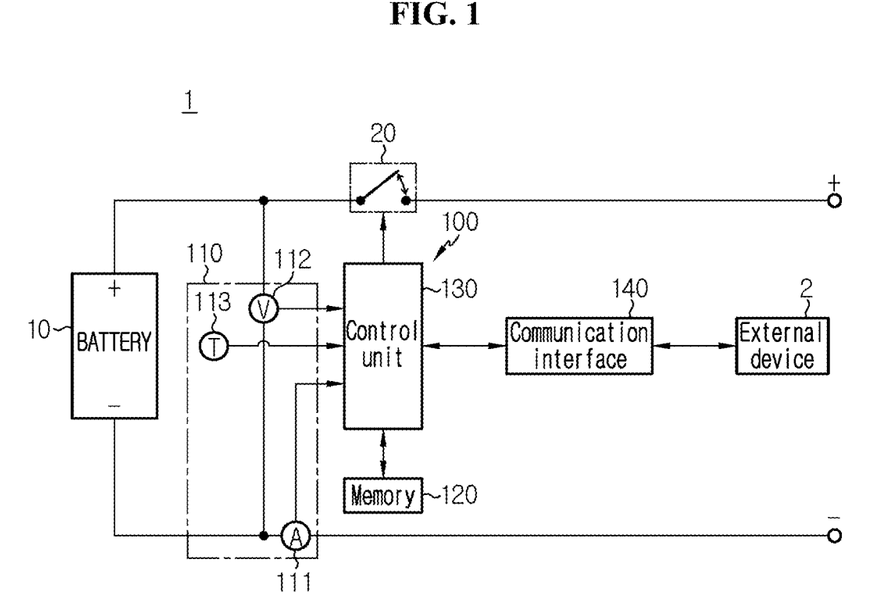
FIG. 1 is a diagram showing the functional configuration of a battery pack according to an embodiment of the present disclosure.

FIG. 1 is a diagram showing the functional configuration of a battery pack 1 according to an embodiment of the present disclosure.

Referring to FIG. 1, the battery pack 1 includes a battery 10, a switch 20 and a battery management system 100. The switch 20 is configured to adjust the magnitude of charge current and/or discharge current of the battery 10 in response to a switching signal (for example, a pulse width modulation signal) from the battery management system 100.

The battery management system 100 is electrically coupled to the battery 10 and configured to monitor and control the state of the battery 10. The battery management system 100 includes a sensing unit 110, a memory 120, a control unit 130 and a communication interface 140.

The sensing unit 110 includes a current measuring unit 111. The current measuring unit 111 measures the current of the battery 10 at each time step defined by a predefined length of time, and transmits a current signal indicating the measured current to the control unit 130. The current at the time of discharging the battery 10 may be referred to as 'discharge current', and the current at the time of charging the battery 10 may be referred to as 'charge current'. The control unit 130 may convert the current signal in analog form transmitted from the current measuring unit 111 to current data in digital form. Hereinafter, assume that the current at the time of charging is measured as a positive value, and the current at the time of discharging is measured as a negative value.

The sensing unit 110 may further include a voltage measuring unit 112. The voltage measuring unit 112 measures the terminal voltage of the battery 10 at each time step, and transmits a voltage signal indicating the measured terminal voltage to the control unit 130. The control unit 130 may convert the voltage signal in analog form transmitted from the voltage measuring unit 112 to voltage data in digital form.

The sensing unit 110 may further include a temperature measuring unit 113. The temperature measuring unit 113 measures the temperature of the battery 10 at each time step, and transmits a temperature signal indicating the measured temperature to the control unit 130. The control unit 130 may convert the temperature signal in analog form transmitted from the temperature measuring unit 113 to temperature data in digital form. The current measuring unit 111, the voltage measuring unit 112 and the temperature measuring unit 113 may operate in time synchronization with each other. Hereinafter, $k^{th}$ time step is expressed as 'time step k'. Additionally, the terminal voltage and the current measured by the sensing unit 110 at the time step k are respectively expressed as V(k) and I(k).

The memory 120 may additionally store data, instructions and software required for the overall operation of the battery management system 100. The memory 120 may store data indicating the result of the operation performed by the control unit 130. The terminal voltage, the current and/or the temperature of the battery 10 measured by the sensing unit 110 at each time step may be recorded in the memory 120 in a sequential order. The memory 120 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The control unit 130 is operably coupled to the sensing unit 110, the memory 120 and the communication interface 140. The control unit 130 records the terminal voltage, the current and/or the temperature of the battery 10 measured by the sensing unit 110 at each time step in the memory 120 in a sequential order. The control unit 130 may move, at each time step, a sliding time window having a predefined size as much as a time interval Δt of the time step, and read a plurality of terminal voltages and a plurality of currents measured in the sliding time window among all terminal voltages and currents recorded in the memory 120 from the memory 120. For example, when the time interval of the time step is 0.01 sec, and the size of the sliding time window is 10 sec, 1000 terminal voltages and 1000 currents may be read from the memory 120 at each time step.

The control unit 130 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The communication interface 140 may be coupled to an external device 2 such as an electronic control unit (ECU) of an electric vehicle to enable communication between. The communication interface 140 may receive a command message from the external device 2, and provide the received command message to the control unit 130. The command message may be a message that requests the activation of a specific function of the apparatus. The communication interface 140 may transmit a notification message from the control unit 130 to the external device 2. The notification message may be a message for informing the external device 2 of the result of the function (for example, the state of charge of the battery) performed by the control unit 130.

Figure 2:
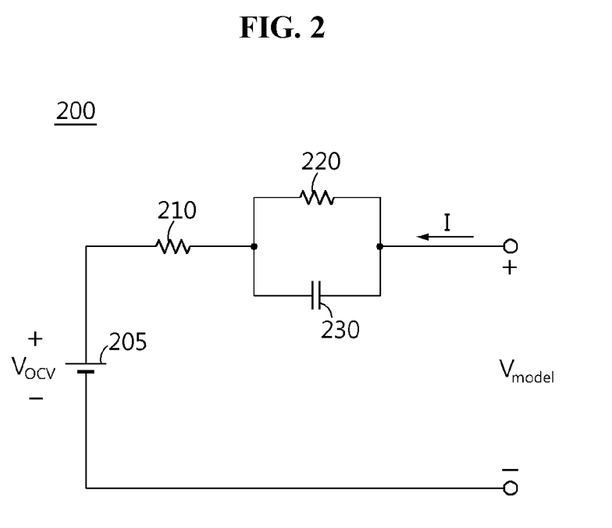
FIG. 2 is a diagram showing an exemplary equivalent circuit model for a battery.

FIG. 2 is a diagram showing an exemplary equivalent circuit model 200 for the battery.

Referring to FIG. 2, the equivalent circuit model 200 may include a voltage source 205, a first resistor 210, a second resistor 220 and a capacitor 230. The parameters of the equivalent circuit model 200 may include the resistance of the first resistor 210, the resistance of the second resistor 220 and the capacitance of the capacitor 230.

The voltage source 205 represents an open circuit voltage (OCV) $V_{OCV}$ of the battery determined from the State Of Charge (SOC) and the temperature of the battery. That is, the OCV $V_{OCV}$ may be uniquely determined when the SOC and the temperature are determined. The OCV $V_{OCV}$ may be predefined for each SOC and each temperature. That is, an OCV-SOC map defining a correlation between the SOC, the temperature and the OCV of the battery may be pre-stored in the memory 110. The OCV at $k^{th}$ time step may be expressed as $V_{OCV}(k)$.

The first resistor 210 models short-term voltage fluctuations by the current flowing through the battery. The terminal voltage measured at the time of charging the battery is higher than the OCV due to the internal resistance of the battery 10. On the contrary, the terminal voltage measured at the time of discharging the battery is lower than the OCV.

The second resistor 220 and the capacitor 230 are connected to each other in parallel. As shown, the second resistor 220 may be connected in series to the first resistor 210. A parallel connection circuit of the second resistor 220 and the capacitor 230 may be referred to as an 'RC pair'. As opposed to the first resistor 210, the second resistor 220 is connected in parallel to the capacitor 230. Accordingly, the RC pair may model the polarization voltage generated during charging and discharging of the battery. That is, the parallel combination of the second resistor 220 and the capacitor 230 is for modeling the transient response history of the battery.

Assume that the resistance of the first resistor 210 and the resistance of the second resistor 220 are constant as $R_1$ and $R_2$, respectively. If Δt is very small, each of the terminal voltage and the current of the battery 10 measured at an arbitrary time step may be constant until the next time step, therefore the OCV of the voltage source 205 may be also handled as being constant between two adjacent time steps.

Assume that the polarization voltage by the RC pair at an arbitrary time point at which the time step k starts is $V_{pola}$, and the resistance of the first resistor 210 and the resistance of the second resistor 220 are constant as $R_1$ and $R_2$, respectively, from the time step k to the time step q. Then, voltage $V_{model}(q)$ of the equivalent circuit model 200 at the time step q may be expressed as the following Equation 1.

$$V_{model}(q) = V_{ocv}(q) + R_1 I(q) + V_{pola} \exp^{-\frac{(q-k)\Delta t}{\tau}} + \qquad \text{<Equation 1>}$$
$$\sum_{i=1}^{q-k} R_2 I(i+k) \left\{ \exp^{-\frac{((q-k)-i)\Delta t}{\tau}} - \exp^{-\frac{((q-k)-i+1)\Delta t}{\tau}} \right\}$$

τ is a preset time constant of the RC pair.

Figure 3:
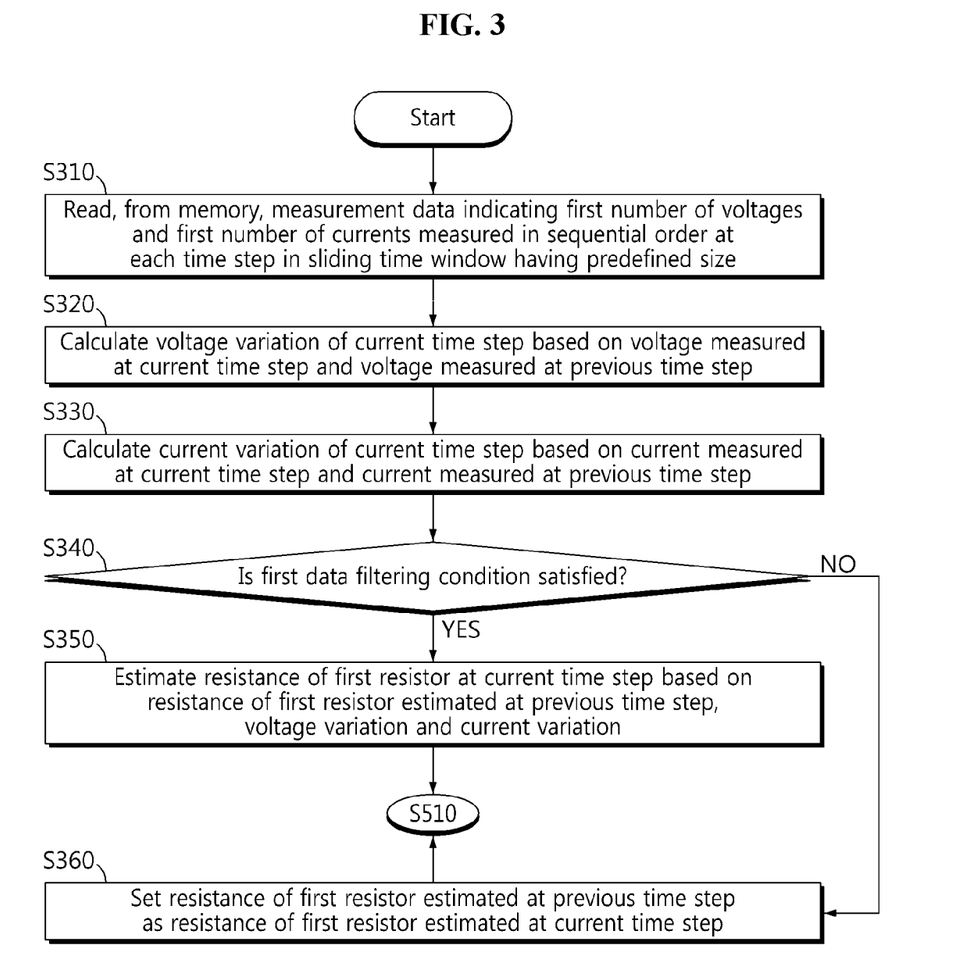
FIG. 3 is a flowchart showing a method for estimating the resistance of a first resistor as one of parameters of an equivalent circuit model according to an embodiment of the present disclosure.
Figure 4:
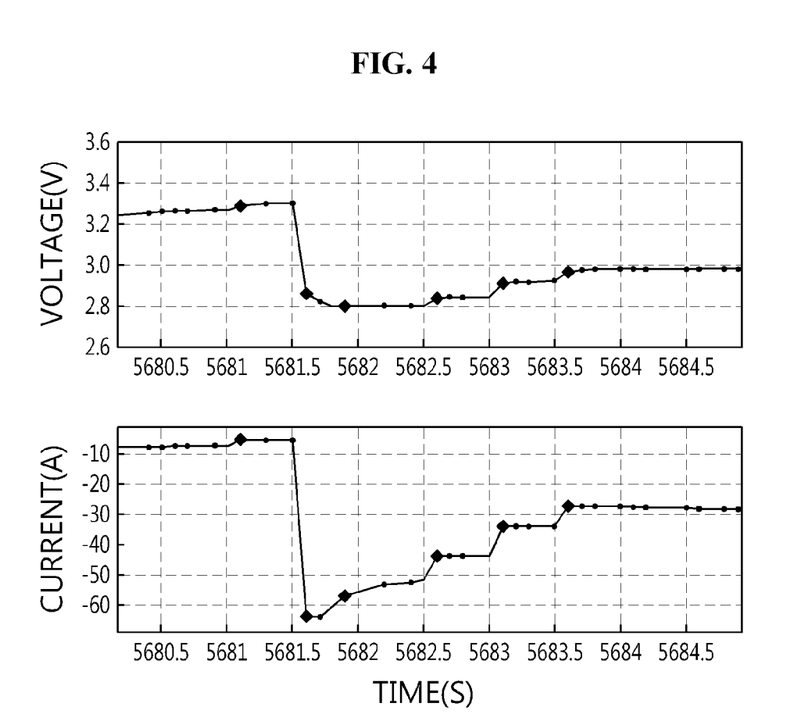
FIG. 4 shows graphs for reference in describing the method of FIG. 3.

FIG. 3 is a flowchart showing a method for estimating the resistance of the first resistor 210 as one of parameters of the equivalent circuit model 200 according to an embodiment of the present disclosure, and FIG. 4 shows graphs for reference in describing the method of FIG. 3.

In step S310, the control unit 130 reads, from the memory 120, measurement data indicating a first number of terminal voltages and a first number of currents measured by the sensing unit 110 in a sequential order at each time step in a sliding time window having a predefined size. That is, the control unit 130 reads, from the memory 120, the first number of terminal voltages and the first number of currents recorded in the memory 120 over a predefined time in the past from the current time step using the sliding time window of which the end time point has moved to the current time step. The predefined time is equal to the size of the sliding time window. The first number is set by the predefined time and the time interval Δt between each time step. For example, when the predefined time=10 sec and Δt=0.01 sec, the first number=10 sec/0.01 sec=1000. Each time the sliding time window moves by Δt, an oldest one of the first number of terminal voltages is discarded, and a newly measured terminal voltage is added. Likewise, each time the sliding time window moves by Δt, an oldest one of the first number of currents is discarded, and a newly measured current is added.

The first number of terminal voltages include terminal voltage V(n) measured at the current time step and terminal voltage V(n−1) measured at the previous time step. The first number of currents include current I(n) measured at the current time step and current I(n−1) measured at the previous time step.

In step S320, the control unit 130 calculates a voltage variation ΔV(n) of the current time step based on the terminal voltage V(n) measured at the current time step and the terminal voltage V(n−1) measured at the previous time step. In this instance, the control unit 130 may calculate the voltage variation ΔV(n) by subtracting the terminal voltage V(n−1) measured at the previous time step from the terminal voltage V(n) measured at the current time step. That is, ΔV(n)=V(n)−V(n−1).

In step S330, the control unit 130 calculates a current variation ΔI(n) of the current time step based on the current I(n) measured at the current time step and the current I(n−1) measured at the previous time step. In this instance, the control unit 130 may calculate the current variation ΔI(n) by subtracting I(n−1) measured at the previous time step from I(n) measured at the current time step. That is, ΔI(n)=I(n)−I(n−1).

Dissimilar to that of FIG. 3, the step S330 may be performed earlier than the step S320, or at the same time as the step S320.

In step S340, the control unit 130 determines whether the voltage variation ΔV(n) and the current variation ΔI(n) satisfy a first data filtering condition. The first data filtering condition is a criterion for determination as to whether ΔV(n) and ΔI(n) are suitable as learning data for estimating the resistance of the first resistor 210.

When (i) the absolute value of the current variation ΔI(n) is larger than a first threshold, and (ii) the multiplication of the voltage variation ΔV(n) and the current variation ΔI(n) is larger than 0, the control unit 130 may determine that the first data filtering condition is satisfied.

The first threshold is a real number greater than 0, and is preset on the basis of a measurement error of the current measuring unit 111. The first resistor 210 is for modeling instantaneous voltage fluctuations formed due to the internal resistance of the battery 10, therefore when the absolute value of ΔI(n) is larger than the first threshold, it is suitable to use ΔI(n) to estimate the resistance of the first resistor 210 at the current time step. In contrast, when the absolute value of ΔI(n) is equal to or less than the first threshold, it is highly likely that ΔI(n) results from the measurement error of the current measuring unit 111, and thus it is unsuitable to use ΔI(n) to estimate the resistance of the first resistor 210 at the current time step.

Additionally, according to the Ohm's law, the voltage of the first resistor 210 is proportional to the current flowing through the first resistor 210. Accordingly, only when ΔV(n) and ΔI(n) have the same sign, it is suitable to use ΔV(n) and ΔI(n) to estimate the resistance of the first resistor 210 at the current time step. In contrast, ΔV(n) having a positive value and ΔI(n) having a negative value or V(n) having a negative value and ΔI(n) having a positive value signify that a voltage change of the first resistor 210 is against the Ohm's law, and thus it is unsuitable to use ΔI(n) to estimate the resistance of the first resistor 210 at the current time step. Each of the two graphs shown in FIG. 4 shows a change in voltage and current of the battery 10 in the same time range. In FIG. 4, the voltage and the current satisfying the first data filtering condition are each marked as a bold dot.

When the value of the step S340 is "YES", the method moves to step S350. On the contrary, when the value of the step S340 is "NO", the method moves to step S360.

In step S350, the control unit 130 estimates the resistance of the first resistor 210 at the current time step based on the resistance $R_{1\_est}(n-1)$ of the first resistor 210 estimated at the previous time step, the voltage variation ΔV(n) and the current variation ΔI(n).

The control unit 130 may estimate the resistance of the first resistor 210 at the current time step using the recursive least square (RLS) algorithm, and a detailed description will be provided below.

First, the weighted sum of squared errors S1 related to resistance estimation of the first resistor 210 may be expressed as the following Equation 2.

$$S1 = \sum_{k=1}^{n} \lambda^{n-k} \{\Delta V(k) - R_{1\_est}(n)\Delta I(k)\}^2 \qquad \text{<Equation 2>}$$

In Equation 2, $R_{1\_est}(n)$ is the resistance of the first resistor 210 to be estimated. Additionally, in Equation 2, λ is a first forgetting factor which is preset as being greater than 0 and smaller than 1. λ will give a smaller influence on the resistance estimation of the first resistor 210 as the terminal voltage and the current are measured at an earlier time in the past from the current time step.

The solution of the weighted sum of squared errors S1, i.e., $R_{1\_est}(n)$ to minimize S1, may be calculated by the following Equations 3 and 4.

$$P_1(n) = \frac{1}{\lambda} \left\{ P_1(n-1) - \frac{P_1(n-1)^2 \Delta I(n)^2}{\lambda + P_1(n-1)\Delta I(n)^2} \right\} \qquad \text{<Equation 3>}$$

-continued $$R_{1\_est}(n) = \\ R_{1\_est}(n-1) + P_1(n)\Delta I(n)\{\Delta V(n) - R_{1\_est}(n-1)\Delta I(n)\}$$ <Equation 4>

$P_1(n)$ and $P_1(n-1)$ are a correction factor of the current time step and a correction factor of the previous time step, respectively. That is, $P_1(n-1)$ is updated to $P_1(n)$ by Equation 4.

In Equation 4, $R_{1\_est}(n-1)$ is the pre-estimated resistance of the first resistor 210 at the previous time step. The control unit 130 may calculate the estimated resistance $R_{1\_est}(n)$ of the first resistor 210 at the current time step using Equation 3 and Equation 4.

For the case in which a value of the symbol n indicating the current time step becomes 1 due to the initialization of the battery management system 100, $P_1(0)$ and $R_{1\_est}(0)$ may be pre-stored in the memory 120 as different initial values. For example, $P_1(0)=(1-\lambda)/(TH_1)^2$, and $TH_1$ may be equal to the first threshold. Additionally, $R_{1\_est}(0)$ may be a preset value corresponding to the temperature of the battery 10 measured at the initial time step. The control unit 130 stores the estimated resistance $R_{1\_est}(n)$ of the first resistor 210 at the current time step in the memory 120.

In step S360, the control unit 130 sets the resistance $R_{1\_est}(n-1)$ of the first resistor 210 estimated at the previous time step as the resistance $R_{1\_est}(n)$ of the first resistor 210 estimated at the current time step. That is, the resistance of the first resistor at the current time step is handled as being equal to the resistance $R_{1\_est}(n-1)$ of the first resistor 210 estimated at the previous time step. Accordingly, dissimilar to S350, $R_{1\_est}(n)=R_{1\_est}(n-1)$.

Figure 5:
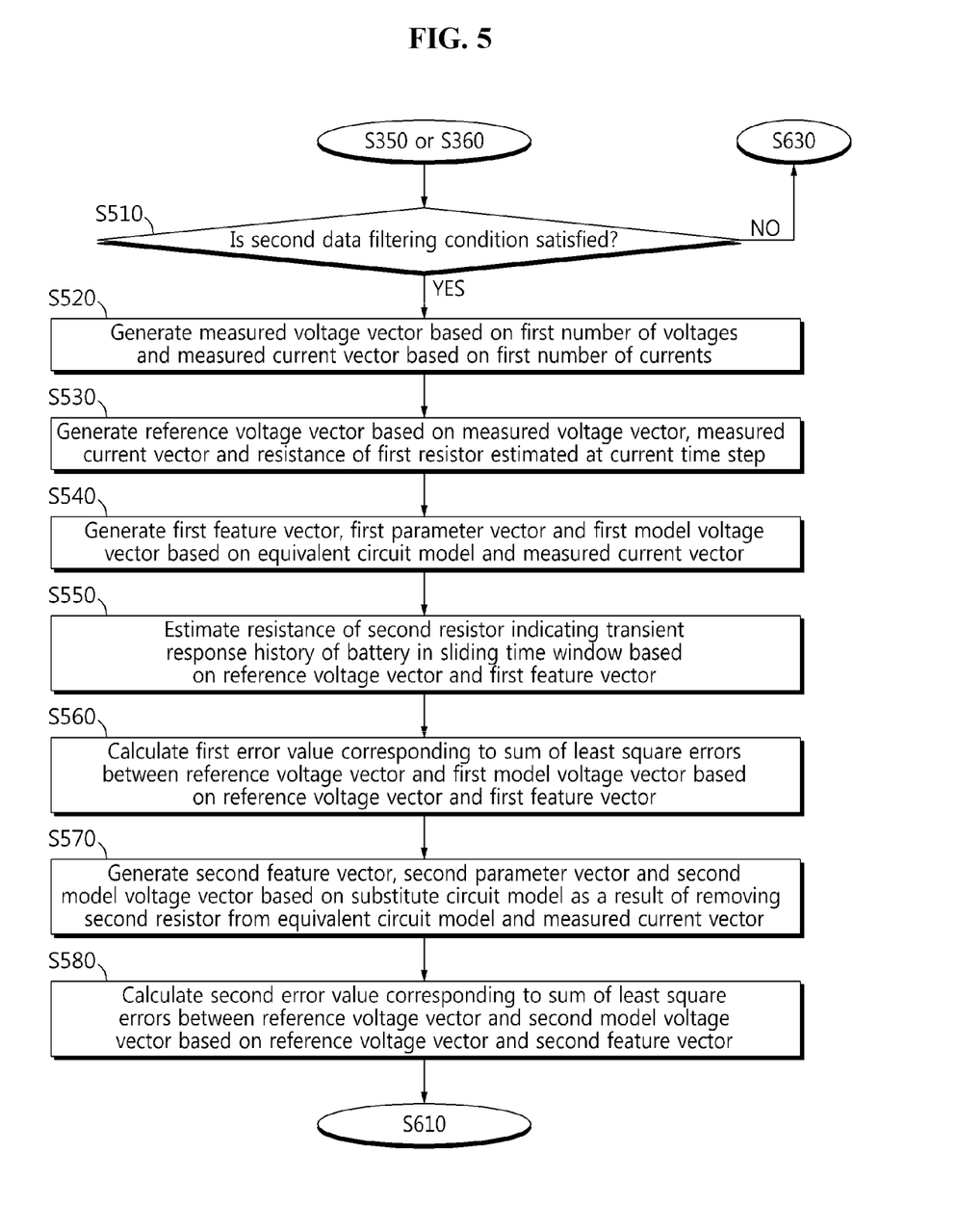
FIGS. 5 and 6 are flowcharts showing a method for estimating the resistance of a second resistor as one of parameters of an equivalent circuit model according to an embodiment of the present disclosure.
Figure 6:
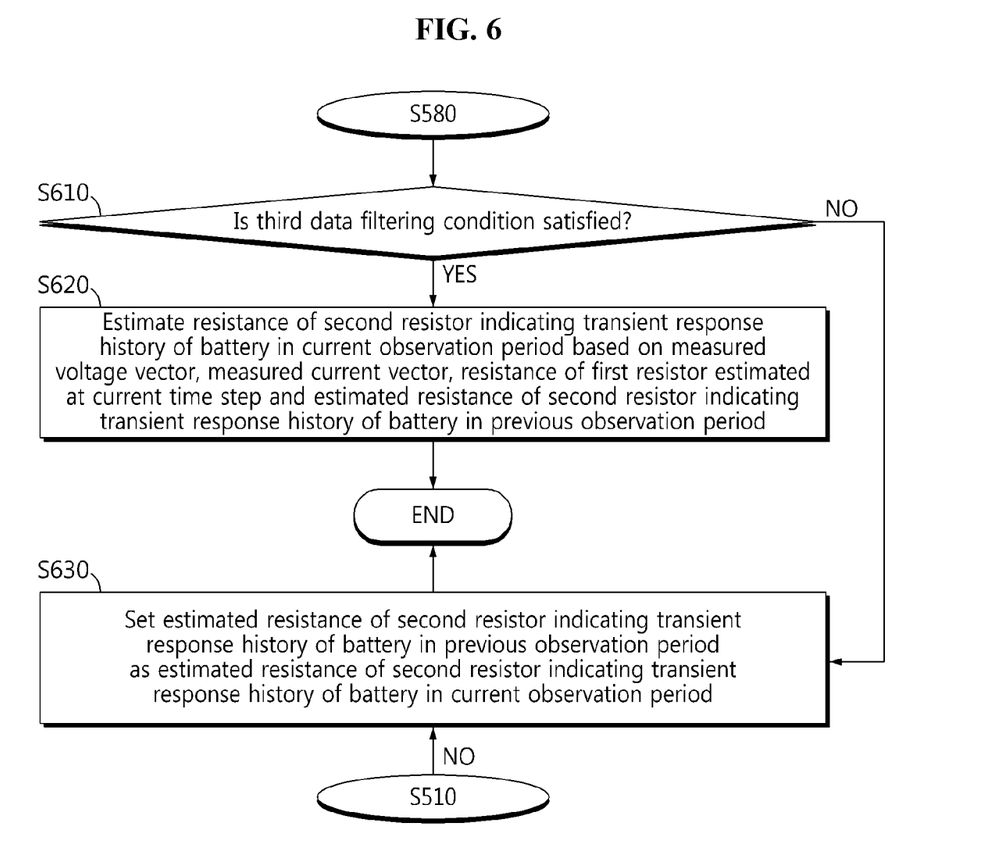
Figure 7:
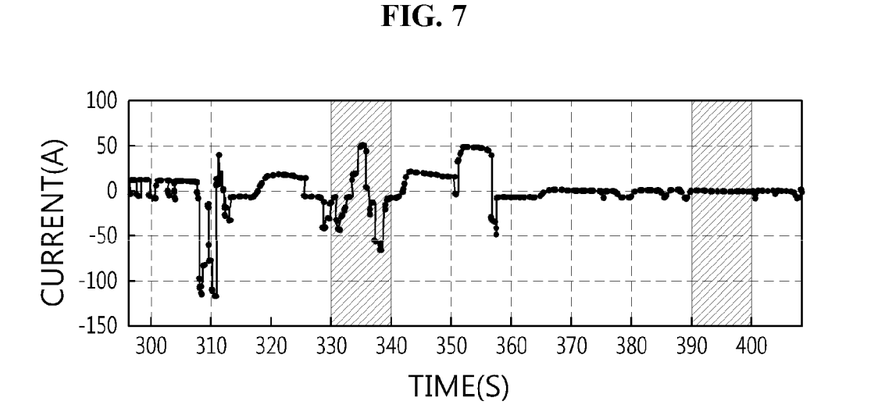
FIG. 7 shows a graph for reference in describing the method of FIG. 5.

FIGS. 5 and 6 are flowcharts showing a method for estimating the resistance of the second resistor 220 as another one of parameters of the equivalent circuit model 200 according to an embodiment of the present disclosure, and FIG. 7 shows a graph for reference in describing the method of FIG. 5.

In step S510, the control unit 130 determines whether the first number of currents satisfy a second data filtering condition. The second data filtering condition is a criterion for determination as to whether the first number of terminal voltages and the first number of currents are suitable as learning data for estimating the resistance of the second resistor 220.

When a difference between the maximum and the minimum of the first number of currents is larger than a second threshold, the control unit 130 may determine that the second data filtering condition is satisfied. The graph shown in FIG. 7 shows a change in the current of the battery 10 measured for a longer time than the size of the sliding time window. Assume that the size of the sliding time window is 10 sec, and the second threshold is 10 A. Seeing FIG. 7, a difference between the maximum and the minimum of the current measured from 330 sec to 340 sec is 100 A or above. Accordingly, the current measured from 330 sec to 340 sec satisfies the second data filtering condition. In contrast, the current measured from 390 sec to 400 sec is constant, and does not satisfy the second data filtering condition.

Due to the capacitor 230, the voltage of the second resistor 220 changes more slowly than the voltage of the first resistor 210. Accordingly, it is preferred that the second threshold is larger than the first threshold.

When the value of the step S510 is "YES", step S520 is performed. When the value of the step S510 is "NO", step S630 is performed.

In step S520, the control unit 130 generates a measured voltage vector based on the first number of terminal voltages and a measured current vector based on the first number of currents. Hereinafter, assume that the first number is m of 2 or greater. Those skilled in the art will understand that n indicating the order of the current time step is larger than m.

The measured voltage vector may be expressed as m×1 matrix as below.

$$V_{vec}=[V(n-m+1)V(n-m+2)V(n-m+3) \ldots V(n)]^T$$

The measured current vector may be expressed as m×1 matrix as below.

$$I_{vec}=[I(n-m+1)I(n-m+2)I(n-m+3) \ldots I(n)]^T$$

In the above, the symbol T indicates the transposed matrix.

In step S530, the control unit 130 generates a reference voltage vector based on the measured voltage vector $V_{vec}$, the measured current vector $I_{vec}$ and the resistance $R_{1\_est}(n)$ of the first resistor 210 estimated at the current time step. $R_{1\_est}(n)$ indicates the internal resistance of the battery 10, and assume that $R_{1\_est}(n)$ is constant in the sliding time window. Then, the reference voltage vector may be expressed as below.

$$Y_{w\_vec}=V_{vec}-R_{1\_est}(n)I_{vec}$$

The reference voltage vector $Y_{w\_vec}$ indicates a result of subtracting the voltage of the internal resistance by each of the first number of currents from each of the first number of terminal voltages.

In step S540, the control unit 130 may generate a first feature vector, a first parameter vector and a first model voltage vector based on the equivalent circuit model 200 and the measured current vector. The first model voltage vector is the multiplication of the first feature vector and the first parameter vector.

Let us r, $K_{vec}$, $H_{ind\_vec}$ and $1_{vec}$ be each defined as below.

$$r = \exp\left(-\frac{\Delta t}{\tau}\right)$$

$$K_{vec} = [r \quad r^2 \quad r^3 \quad \ldots \quad r^m]^T$$

$$H_{ind\_vec} = (1-r)\begin{bmatrix} 1 & 0 & 0 & \ldots & 0 \\ r & 1 & 0 & \ldots & 0 \\ r^2 & r & 1 & \ldots & 0 \\ \vdots & \vdots & \vdots & \ddots & \vdots \\ r^{m-1} & r^{m-2} & r^{m-3} & \ldots & 1 \end{bmatrix} I_{vec}$$

$$1_{vec} = [1 \quad 1 \quad 1 \quad \ldots \quad 1]^T$$

In case that the OCV of the voltage source 205 is constant as $V_{OCV}$ in the sliding time window, when the above definition is applied to Equation 1, the first model voltage vector expressed as the following Equation 5 may be derived.

$$V_{model1\_vec}=V_{ocv}1_{vec}+R_2 H_{ind\_vec}+V_{pola}K_{vec}=[1_{vec} H_{ind\_vec} K_{vec}][V_{ocv} R_2 V_{pola}]^T$$ <Equation 5>

In Equation 5, when $X_{1\_vec}=[1_{vec}\ H_{ind\_vec}\ K_{vec}]$, $\beta_{1\_vec}=[V_{ocv}\ R_2\ V_{pola}]^T$, Equation 5 may be simplified as the following Equation 6. The first model voltage vector may be a result of modeling the reference voltage vector.

$$V_{model1\_vec}=X_{1\_vec}\beta_{1\_vec}$$ <Equation 6>

$X_{1\_vec}$ is the first feature vector expressed as m×3 matrix. $\beta_{1\_vec}$ is the first parameter vector expressed as 3×1 matrix, and converts the first feature vector to the first model voltage vector. The three components included in the first parameter vector are all unknown.

In step S550, the control unit 130 estimates the resistance of the second resistor 220 indicating the transient response history of the battery in the sliding time window based on the reference voltage vector and the first feature vector.

The sum of square errors S2 between the reference voltage vector and the first model voltage vector may be expressed as the following Equation 7.

$$S2 = \|Y_{w\_vec} - V_{model1\_vec}\|^2 = \|Y_{w\_vec} - X_{1\_vec}\beta_{1\_vec}\|^2 \quad \text{<Equation 7>}$$

The control unit 130 may estimate the first parameter vector to minimize the sum of square errors S2 using the following Equation 8.

$$\beta_{1\_win} = [V_{ocv\_win} R_{2\_win} V_{pola\_win}]^T = (X_{1\_vec}^T X_{1\_vec})^{-1} X_{1\_vec}^T Y_{w\_vec} \quad \text{<Equation 8>}$$

The transient response history of the battery generated in the sliding time window is defined by the first number of terminal voltages and the first number of currents. Accordingly, the component $R_{2\_win}$ of the first parameter vector estimated using the above Equation 8 is the estimated resistance of the second resistor 220 indicating the transient response history of the battery in the sliding time window.

In step S560, the control unit 130 may calculate a first error value corresponding to the sum of least square errors S3 between the reference voltage vector and the first model voltage vector based on the reference voltage vector and the first feature vector.

The control unit 130 may calculate the sum of least square errors S3 using the following Equation 9 related to the method of least squares.

$$S3 = Y_{w\_vec}^T \{E - X_{1\_vec}(X_{1\_vec}^T X_{1\_vec})^{-1} X_{1\_vec}^T\} Y_{w\_vec} \quad \text{<Equation 9>}$$

In Equation 9, E is the unit matrix.

The first error value may be any one of (i) S3, (ii) the mean of S3, i.e., S3/m, and (iii) the square root of S3/m.

In step S570, the control unit 130 may generate a second feature vector, a second parameter vector and a second model voltage vector based on a substitute circuit model as a result of removing the second resistor 220 from the equivalent circuit model 200 and the measured current vector. The second model voltage vector is the multiplication of the second feature vector and the second parameter vector.

As the substitute circuit model is free of the second resistor 220 of the equivalent circuit model 200, the second parameter vector is expressed as $\beta_{2\_v} = [V_{ocv}\ V_{pola}]^T$ as a result of removing $R_2$ from the first parameter vector, and the second feature vector is expressed as $X_{2\_vec} = [1_v\ k_v]$ as a result of removing $H_{ind\_v}$ from the first feature vector. Accordingly, the second model voltage vector may be expressed as the following Equation 10.

$$V_{model2\_vec} = X_{2\_vec}\beta_{2\_vec} \quad \text{<Equation 10>}$$

In step S580, the control unit 130 may calculate a second error value corresponding to the sum of least square errors S4 between the reference voltage vector and the second model voltage vector based on the reference voltage vector and the second feature vector.

The control unit 130 may calculate the sum of least square errors S4 using the following Equation 11 related to the method of least squares.

$$S4 = Y_{w\_cec}^T \{E - X_{2\_vec}(X_{2\_vec}^T X_{2\_vec})^{-1} X_{2\_vec}^T\} Y_{w\_vec} \quad \text{<Equation 11>}$$

The second error value may be any one of (i) S4, (ii) the mean of S4, i.e., S4/m, and (iii) the square root of S4/m.

In step S610, the control unit 130 determines whether a third data filtering condition is satisfied based on the estimated resistance $R_{2\_win}$ of the second resistor 220 indicating the transient response history of the battery in the sliding time window, the first error value and the second error value.

In detail, in step S610, the control unit 130 determines each of (i) whether $R_{2\_win}$ is larger than 0 ohm, and (ii) whether the second error value is larger than a value obtained by multiplying the first error value by a scaling factor (for example, 1.1) preset greater than 1. That is, the third data filtering condition may be satisfied when $R_{2\_win}$ is larger than 0 ohm and the second error value is larger than a value obtained by multiplying the first error value by the scaling factor.

In the physical aspect, actually, the resistance of the second resistor 220 cannot be 0 ohm or less. Accordingly, $R_{2\_win}$ of 0 ohm or less indicates that the first number of terminal voltages and the first number of currents are unsuitable for resistance estimation of the second resistor 220. Additionally, as described above, the second error value indicates that the polarization voltage by the RC pair is not taken into consideration. Accordingly, the value obtained by multiplying the first error value by the scaling factor being larger than the second error value indicates that the first number of terminal voltages and the first number of currents fail to properly reflect the dynamic characteristics of voltage generated by the second resistor 220.

When the third data filtering condition is satisfied, S620 is performed, and otherwise, S630 is performed.

In step S620, the control unit 130 estimates the resistance of the second resistor 220 indicating the transient response history of the battery in the current observation period based on the measured voltage vector, the measured current vector, the resistance $R_{1\_est}(n)$ of the first resistor 210 estimated at the current time step and the estimated resistance $R_{2\_est}(n-1)$ of the second resistor 220 indicating the transient response history of the battery 10 in the previous observation period. The previous observation period is a period from the initial time step to the previous time step. The current observation period is a period from the initial time step to the current time step.

The control unit 130 may estimate the resistance of the second resistor 220 at the current time step using the following Equation 12 representing a function based on the RLS algorithm.

$$R_{2\_est}(n) = f(R_{1\_est}(n), R_{2\_est}(n-1), V_{vec}, I_{vec}) \quad \text{<Equation 12>}$$

In Equation 12, the function f( ) outputs $R_{2\_est}(n)$ when $R_{1\_est}(n)$, $R_{2\_est}(n-1)$, $V_{vec}$ and $I_{vec}$ are inputted. $R_{2\_est}(n-1)$ is the estimated resistance of the second resistor 220 indicating the transient response history of the battery in the previous observation period. Likewise, $R_{2\_est}(n)$ is the estimated resistance of the second resistor 220 indicating the transient response history of the battery in the current observation period.

In step S630, the control unit 130 sets the estimated resistance $R_{2\_est}(n-1)$ of the second resistor 220 indicating the transient response history of the battery 10 in the previous observation period as the estimated resistance $R_{2\_est}(n)$ of the second resistor 220 indicating the transient response history of the battery 10 in the current observation period. That is, the transient response history of the battery 10 in the previous observation period is handled as being equal to the transient response history of the battery 10 in the current observation period. Accordingly, dissimilar to S620, $R_{2\_est}(n)=R_{2\_est}(n-1)$.

The control unit 130 may predict the terminal voltage of the battery 10 using the estimated resistance $R_{1\_est}(n)$ of the first resistor 210 and the estimated resistance $R_{2\_est}(n)$ of the second resistor 220, and adjust the duty cycle of the switching signal outputted to the switch 20 based on the predicted terminal voltage.

The control unit 130 may estimate the SOC of the battery 10 at the current time step using the estimated resistance $R_{1\_est}(n)$ of the first resistor 210 and the estimated resistance $R_{2\_est}(n)$ of the second resistor 220, and adjust the duty cycle of the switching signal outputted to the switch 20 based on the estimated SOC.

Data indicating the results of performing each step shown in FIGS. 3, 5 and 6 may be stored in the memory 120 by the control unit 130 whenever each step is finished.

The embodiments of the present disclosure described hereinabove are not implemented only through the apparatus and method, and may be implemented through programs that perform functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

LIST OF REFERENCE NUMBERS

1: battery pack
10: battery
20: switch
100: battery management system
110: sensing unit
120: memory
130: control unit
140: communication interface
200: equivalent circuit model
210: first resistor
220: second resistor
230: capacitor

What is claimed is:

1. A method for estimating parameters of an equivalent circuit model for a battery, the equivalent circuit model including a first resistor, a second resistor connected in series to the first resistor, and a capacitor connected in parallel to the second resistor, the method being performed by a battery management system in a battery pack, the method comprising:
reading, from a memory, measurement data indicating a first number of terminal voltages and a first number of currents, measured in a sequential order at each time step in a sliding time window having a predefined size;
calculating a voltage variation of a current time step based on a terminal voltage measured at the current time step and a terminal voltage measured at a previous time step included in the first number of terminal voltages;
calculating a current variation of the current time step based on a current measured at the current time step and a current measured at the previous time step included in the first number of currents;
estimating a resistance of the first resistor at the current time step based on a resistance of the first resistor estimated at the previous time step, the voltage variation, and the current variation;
generating:
a measured voltage vector based on the first number of terminal voltages; and
a measured current vector based on the first number of currents;
estimating a resistance of the second resistor at the current time step based on:
the measured voltage vector;
the measured current vector;
the resistance of the first resistor estimated at the current time step; and
a resistance of the second resistor estimated at the previous time step; and
adjusting a duty cycle of a switching signal outputted to a switch in the battery pack based on one or more of:
a predicted terminal voltage that is predicted using the estimated resistance of the first resistor and the estimated resistance of the second resistor; and
an estimated state of charge (SOC) of the battery that is estimated at the current time step using the estimated resistance of the first resistor and the estimated resistance of the second resistor.

2. The method according to claim 1, wherein:
the estimating the resistance of the first resistor at the current time step is performed when a first data filtering condition is satisfied; and
the first data filtering condition is satisfied when:
an absolute value of the current variation is larger than a first threshold; and
multiplication of the voltage variation and the current variation is a positive value.

3. The method according to claim 2, further comprising, when the first data filtering condition is not satisfied, setting the resistance of the first resistor estimated at the previous time step as the resistance of the first resistor estimated at the current time step.

4. The method according to claim 1, wherein the estimating the resistance of the first resistor at the current time step includes the following Equations 1 and 2 related to a recursive least square algorithm:

$$P_1(n) = \frac{1}{\lambda}\left\{P_1(n-1) - \frac{P_1(n-1)^2 \Delta I(n)^2}{\lambda + P_1(n-1)\Delta I(n)^2}\right\} \quad \text{<Equation 1>}$$

$$R_{1\_est}(n) = \quad \text{<Equation 2>}$$
$$R_{1\_est}(n-1) + P_1(n)\Delta I(n)\{\Delta V(n) - R_{1\_est}(n-1)\Delta I(n)\},$$

where:
$P_1(n)$ is a correction factor for the current time step,
$P_1(n-1)$ is a correction factor for the previous time step,
$\Delta I(n)$ is the current variation, ΔV(n) is the voltage variation, λ is a predefined forgetting factor, $R_{1\_est}(n)$ is the resistance of the first resistor estimated at the current time step, and $R_{1\_est}(n-1)$ is the resistance of the first resistor estimated at the previous time step.

5. The method according to claim 1, wherein:
the estimating the resistance of the second resistor at the current time step is performed when the first number of currents satisfy a second data filtering condition; and
the second data filtering condition is satisfied when a difference between maximum and minimum of the first number of currents is larger than a second threshold.

6. The method according to claim 1, wherein the estimating the resistance of the second resistor at the current time step comprises:
generating the measured voltage vector based on the first number of terminal voltages and the measured current vector based on the first number of currents;
generating a reference voltage vector based on the measured voltage vector, the measured current vector, and the resistance of the first resistor estimated at the current time step;
generating a first feature vector, a first parameter vector, and a first model voltage vector based on the equivalent circuit model and the measured current vector;
estimating a resistance of the second resistor indicating transient response history of the battery in the sliding time window based on the reference voltage vector and the first feature vector;
calculating a first error value corresponding to a sum of least square errors between the reference voltage vector and the first model voltage vector based on the reference voltage vector and the first feature vector;
generating a second feature vector, a second parameter vector, and a second model voltage vector based on a substitute circuit model as a result of removing the second resistor from the equivalent circuit model and the measured current vector;
calculating a second error value corresponding to a sum of least square errors between the reference voltage vector and the second model voltage vector based on the reference voltage vector and the second feature vector;
determining whether a third data filtering condition is satisfied based on the estimated resistance of the second resistor indicating the transient response history of the battery in the sliding time window, the first error value, and the second error value; and
when the third data filtering condition is satisfied, estimating a resistance of the second resistor indicating the transient response history of the battery in a current observation period from an initial time step to the current time step based on the measured voltage vector, the measured current vector, the resistance of the first resistor estimated at the current time step, and the resistance of the second resistor estimated at the previous time step.

7. The method according to claim 6, wherein the third data filtering condition is satisfied when:
the estimated resistance of the second resistor indicating the transient response history of the battery in the sliding time window is larger than 0 ohms (Ω); and
the second error value is larger than a value obtained by multiplying the first error value by a preset scaling factor.

8. The method according to claim 1, wherein the estimating the resistance of the second resistor at the current time step uses a recursive least square algorithm.

9. A battery management system for estimating parameters of an equivalent circuit model for a battery, the equivalent circuit model including a first resistor, a second resistor connected in series to the first resistor, and a capacitor connected in parallel to the second resistor, the battery management system comprising:
a sensing unit configured to measure a terminal voltage and a current of the battery at each time step; and
a control unit operably coupled to the sensing unit, the control unit being configured to:
record the terminal voltage and the current measured by the sensing unit at each time step in a memory;
read, from the memory, measurement data indicating a first number of terminal voltages and a first number of currents, measured in a sequential order at each time step in a sliding time window having a predefined size;
calculate a voltage variation of a current time step based on a terminal voltage measured at the current time step and a terminal voltage measured at a previous time step included in the first number of terminal voltages;
calculate a current variation of a current time step based on a current measured at the current time step and a current measured at the previous time step included in the first number of currents;
estimate a resistance of the first resistor at the current time step based on a resistance of the first resistor estimated at the previous time step, the voltage variation, and the current variation;
generate a measured voltage vector based on the first number of terminal voltages and a measured current vector based on the first number of currents; and
estimate a resistance of the second resistor at the current time step based on:
the measured voltage vector;
the measured current vector;
the resistance of the first resistor estimated at the current time step; and
a resistance of the second resistor estimated at the previous time step.

10. The battery management system according to claim 9, wherein the control unit is further configured to:
generate:
the measured voltage vector based on the first number of terminal voltages; and
the measured current vector based on the first number of currents,
generate a reference voltage vector based on the measured voltage vector, the measured current vector, and the resistance of the first resistor estimated at the current time step,
generate a first feature vector, a first parameter vector, and a first model voltage vector based on the equivalent circuit model and the measured current vector,
estimate a resistance of the second resistor indicating transient response history of the battery in the sliding time window based on the reference voltage vector and the first feature vector,
calculate a first error value corresponding to a sum of least square errors between the reference voltage vector and the first model voltage vector based on the reference voltage vector and the first feature vector, generate a second feature vector, a second parameter vector, and a second model voltage vector based on a substitute circuit model as a result of removing the second resistor from the equivalent circuit model and the measured current vector, calculate a second error value corresponding to a sum of least square errors between the reference voltage vector and the second model voltage vector based on the reference voltage vector and the second feature vector, determine whether a third data filtering condition is satisfied based on the estimated resistance of the second resistor indicating the transient response history of the battery in the sliding time window, the first error value, and the second error value, and when the third data filtering condition is satisfied, estimate a resistance of the second resistor indicating the transient response history of the battery in a current observation period from an initial time step to the current time step based on the measured voltage vector and the measured current vector.

11. The battery management system according to claim 9, wherein the third data filtering condition is satisfied when:

the estimated resistance of the second resistor indicating the transient response history of the battery in the sliding time window is larger than 0 ohms ($\Omega$); and the second error value is larger than a value obtained by multiplying the first error value by a preset scaling factor.

* * * * *